US00RE34317E

United States Patent [19]

Ikeda

[11] E Patent Number: Re. 34,317

[45] Reissued Date of Patent: Jul. 20, 1993

[54] VARIABLE FREQUENCY OSCILLATOR

[75] Inventor: Masayuki Ikeda, Suwa, Japan

[73] Assignee: Seiko Epson Corporation, Tokyo, Japan

[21] Appl. No.: 798,064

[22] Filed: Nov. 27, 1991

Related U.S. Patent Documents

Reissue of:

[64] Patent No.: 4,567,448
Issued: Jan. 28, 1986
Appl. No.: 520,270
Filed: Aug. 4, 1983

U.S. Applications:

[63] Continuation of Ser. No. 693,050, Apr. 30, 1991, abandoned, which is a continuation of Ser. No. 149,033, Jan. 27, 1988, abandoned.

[30] Foreign Application Priority Data

Aug. 5, 1982 [JP] Japan ..... 57-136683
Aug. 5, 1982 [JP] Japan ..... 57-136684

[51] Int. Cl.[5] ..... H03L 7/00
[52] U.S. Cl. ..... 331/25; 331/2
[58] Field of Search ..... 331/2, 17, 25, 20, 47, 331/55, 1 A, 8, 10, 11, 18, 34

[56] References Cited

U.S. PATENT DOCUMENTS 3,328,718 6/1967 Murray ..... 331/2
4,117,420 9/1978 DeConinck et al. ..... 331/17
4,198,659 4/1980 Iijima et al. ..... 358/150
4,358,741 11/1982 Nardin ..... 331/25

FOREIGN PATENT DOCUMENTS 2735642 2/1978 Fed. Rep. of Germany .
124953 11/1974 Japan .
52-60052 5/1977 Japan .
53-21558 2/1978 Japan .
5615128 7/1979 Japan .
57-181232 11/1982 Japan .
1537847 1/1979 United Kingdom .
2012129 7/1979 United Kingdom .

OTHER PUBLICATIONS

"Improving Frequency Acquisition of a Costas Loop" by Charles Cahn, IEEE transactions on Communications, vol. Com. 25, No. 12, Dec. 1977 pp. 1453-1459.

*Primary Examiner*—David Mis
*Attorney, Agent, or Firm*—Blum Kaplan

[57] ABSTRACT

A variable frequency oscillator circuit adapted for stabilization of its free-running frequency comprises a first signal synthesizing circuit, first voltage-controlled oscillator, a phase-locked loop and reference signal generator, the phase-locked loop consisting of a second signal synthesizing circuit, second voltage-controlled oscillator, phase comparator and low-pass filter. The first and second signal synthesizing circuits have the same characteristics, and the first and second voltage-controlled oscillators have the same characteristics. The reference signal and output of the second voltage-controlled oscillator are input to the phase comparator. The comparator output is applied to the first and second signal synthesizing circuits. An external signal is applied to the first signal synthesizing circuit, and the output of the first voltage-controlled oscillator acts as the output of the variable frequency oscillator circuit.

The principles are applied to reading data pulses from a floppy disk.

12 Claims, 8 Drawing Sheets

FIG. 5
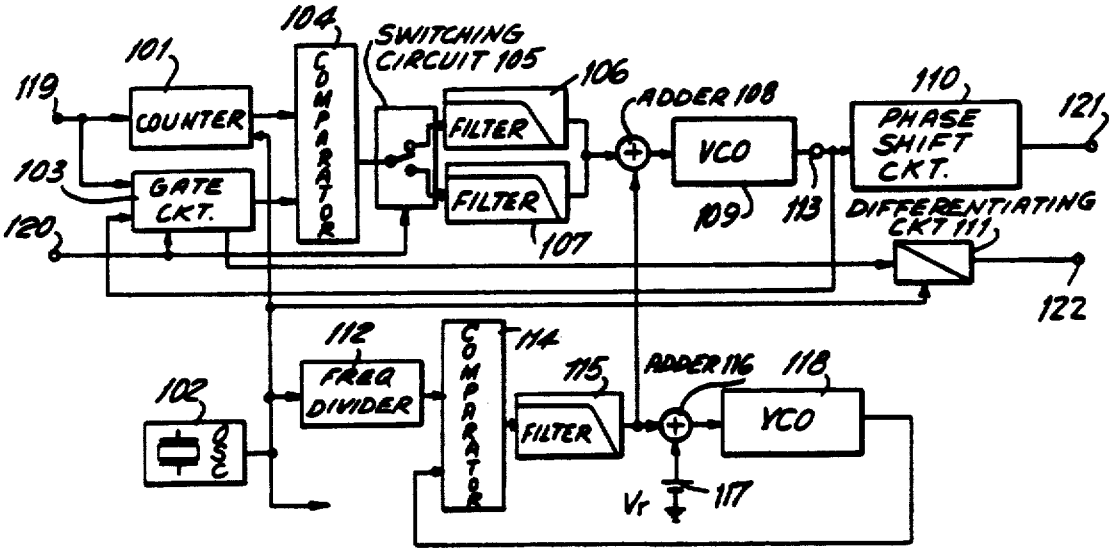
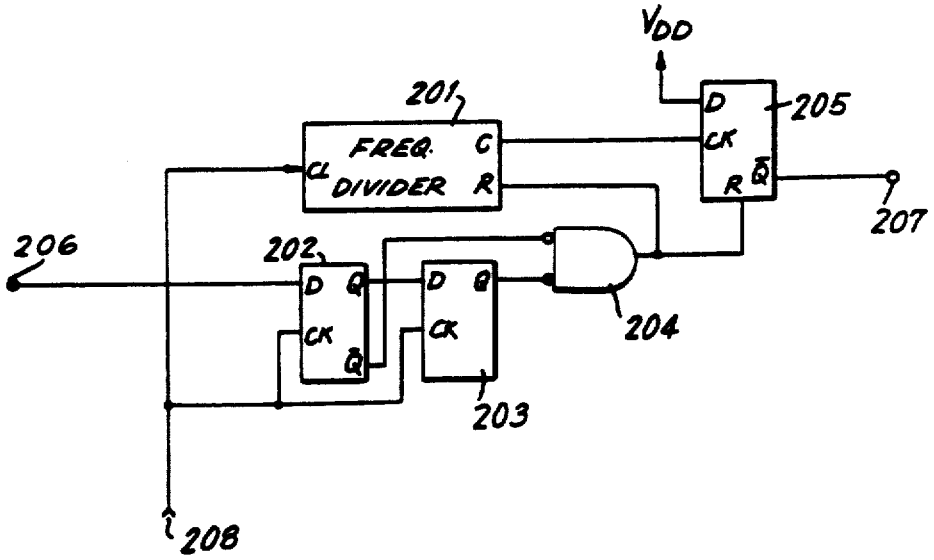
FIG. 6a

FIG.7a
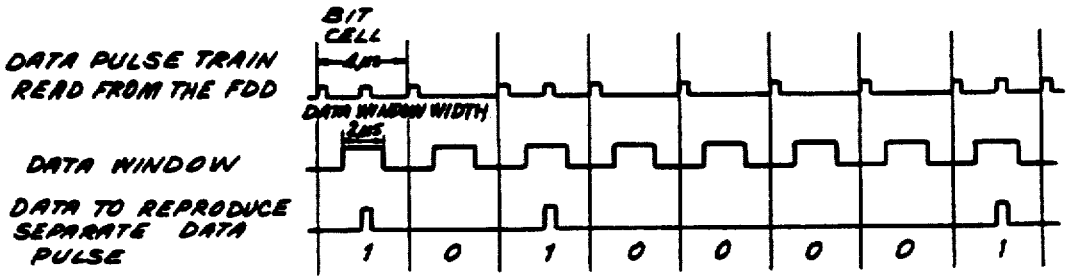
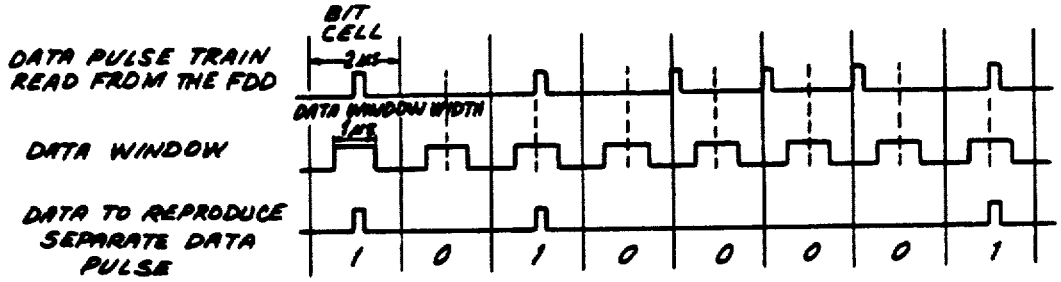
FIG.7b
FIG.8
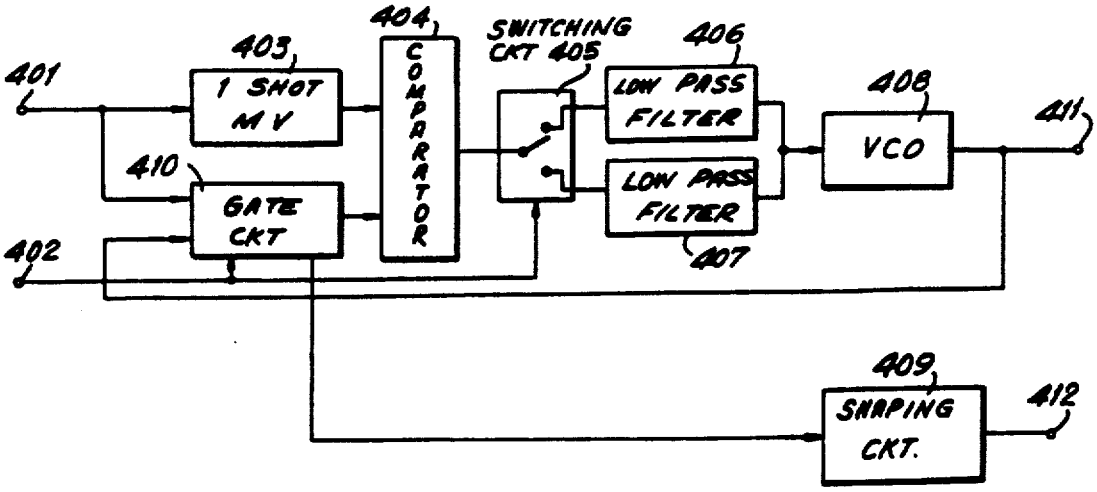

VARIABLE FREQUENCY OSCILLATOR

Matter enclosed in heavy brackets [ ] appears in the original patent but forms no part of this reissue specification; matter printed in italics indicates the additions made by reissue.

*This is a continuation of application Ser. No. 07/693,050, filed Apr. 30, 1991, now abandoned, which is a continuation of application Ser. No. 07/149,033, filed Jan. 27, 1988, now abandoned.*

BACKGROUND OF THE INVENTION

The present invention relates to a voltage-controlled oscillator circuit used in a phase-locked loop or the like and, more particularly, to such a circuit intended for stabilization of its free-running frequency, and its application to reading a floppy disk. A fairly large number of voltage-controlled oscillator circuits have already been disclosed. As an example, a voltage-controlled oscillator circuit for use in a complementary metal-oxide integrated circuit on one chip used for a phase-locked loop (PLL), is shown in FIG. 3, wherein the electric current flowing into a capacitor $C_1$ is controlled by a control voltage applied to the gate of an N-channel transistor $N_1$ to control the frequency of oscillation. Resistors $R_1$ and $R_2$ determine the control voltage sensitivity coefficient and the free-running frequency, respectively.

Another example as disclosed in Japanese Patent Publication No. 86509/81 is shown in FIG. 4, wherein current flowing into ring oscillators is controlled by the gate voltage to transistors $T_{41}$–$T_{46}$ connected to the sources to control the frequency of oscillation. This circuit has advantages over the circuit of FIG. 3 in dispensing with externally attached parts and requiring less electric operating current and less space to mount components, but it is difficult to obtain good accuracy and stability. Also, it cannot be said that the circuit of FIG. 4 has a sufficient stability.

Generally, what must be regulated in a voltage-controlled oscillator circuit are the free-running frequency and the voltage control sensitivity coefficient. The free-running frequency is defined as the frequency of oscillation when the control voltage applied to the control terminal of a voltage-controlled oscillator circuit is at a reference level. The reference level is usually set at a central value of the controllable range of input voltage. For instance, in the case of a CMOS IC, the reference level is set to half of the power supply voltage. If it is assumed that the difference between the control voltage $V_c$ and the reference voltage level $V_s$ is $\Delta V_c$, then $$\Delta V_c = V_c - V_s$$

$$\Delta V_c = V_c = V_s \quad (1)$$

Thus, it may also be said that the free-running frequency is the frequency of oscillation when $\Delta V_c = 0$. The voltage control sensitivity coefficient $K_v$ is defined by $$f_o = f_c + K_v \Delta V \quad (2)$$

where $f_c$ is the free-running frequency and $f_o$ is the frequency of oscillation of that voltage-controlled oscillator circuit.

Drift in the free-running frequency in a PLL has an adverse effect on the loop because it introduces drift in the capture range of the system. Also, dispersion in the frequency $f_c$ due to dispersion in constants of circuit components is so large that it cannot be neglected. Therefore, high-precision components have been conventionally used at the sacrifice of curtailment of cost, or otherwise adjustments or alignments using semifixed resistors or semifixed capacitors have been required after assembly. Also, drift in the voltage in the voltage control sensitivity coefficient $K_v$ in a PLL has an adverse effect on the loop because it results in drift in the response velocity of the system.

These drifts are attributed to change in the ambient temperature, fluctuation in the power supply voltage. aging of component constants, etc. Especially the free-running frequency $f_c$ is affected greatly by these factors. On the other hand, variation in the coefficient $K_v$ can be reduced by providing sufficient relative tracking characteristics employing semiconductor and integrated circuit techniques such that the value $K_v$ depends on relative accuracy among components of the circuit, although absolute accuracy of the constants of elements is not obtained.

It is possible even with prior art techniques to fabricate the components of the variable-frequency oscillator on one chip by attaching discrete components to the outside surface of the chip, and fabricating the other components in a semiconductor integrated circuit format. However, features inherent in semiconductor integrated circuitry cannot be fully achieved from such construction. Specifically, the amount of space to mount components cannot be made small. Also, a large number of junction points do not assure good reliability and operation. The number of steps for mounting components and the cost of fabricating this circuit cannot be reduced. Thus, a considerable limitation is imposed on the design of such a chip for a semiconductor integrated circuit.

In particular, when connections are made to externally attach components from elements inside of the semiconductor integrated circuit chip, a considerably larger chip area is needed as compared with a construction where no connections are required, because pads for connection, and transistors in the outer buffer circuits are several ten-times as large as those of a device eliminating external connections. Furthermore, the cost of packaging for the integrated circuit is increased.

Another disadvantage of the prior art circuitry is that adjustments are necessary after assembly. This results from the fact that stable and precise variable frequency oscillators are not available.

What is needed is a variable frequency oscillator which is highly stable and produces substantially by integrated circuit techniques with small size, low cost and no necessity for adjustment after assembly.

SUMMARY OF THE INVENTION

Generally speaking, in accordance with the invention, a variable frequency oscillator especially suitable for stable operation under variable conditions is provided. The circuit includes a pair of voltage controlled oscillator circuits (VCO) having the same characteristics. Also included are a phase comparator circuit and an oscillator circuit which generates a signal having a stable frequency, for example, as generated by a crystal oscillator circuit. The comparator compares the outputs of the two oscillator circuits and delivers a signal with a frequency proportional to the phase difference between the two signals. After filtering, the output of the phase comparator is inversely fed back to the second voltage controlled oscillator and the oscillation frequency of the second VCO is made equal to the reference oscillator frequency. Signals from the PLL loop associated with the second VCO are input to the circuits associated with the first VCO and because of the similar constructions of the two circuits, the two circuits output the same frequency. Therefore, the output of the first VCO is stabilized by the phase lock loop circuit of the second VCO. Variations due to factors, for example, aging, act similarly on both VCO circuits and as a result the two VCOs continue to output the same frequencies controlled by the external frequency standard and the phase lock loop, frequency standard and the phase lock loop.

The application of these principles to producing precise data windows for reading data bits from a floppy disk is also described herein.

Accordingly, it is an object of the invention to provide an improved variable frequency oscillator circuit which is capable of supressing drifting encountered in the prior art circuits and reducing variations in constants $f_c$ and $K_v$ of the oscillator circuit caused by scatter in constants of circuit components, thereby to enhance stability of the circuit.

It is another object of the invention to provide an improved variable frequency oscillator circuit which suppresses variation in the absolute accuracy of circuit components, whereby it can readily be formed into an integrated circuit.

It is yet another object of the invention to provide an improved variable frequency oscillator for a floppy disk that can readily be fabricated in the form of a monolithic semiconductor integrated circuit.

Another object of the invention is to provide an improved variable frequency oscillator which is more economical to fabricate and has an improved reliability.

A further object of the invention to provide an improved variable frequency oscillator in the form of a semiconductor integrated circuit which requires less externally attached components.

Still another object of the invention is to provide a variable frequency oscillator which does not necessitate adjustments after assembly.

Still other objects and advantages of the invention will in part be obvious and will in part be apparent from the specification.

The invention accordingly comprises the features of construction, combination of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 5 is a block diagram of an alternative embodiment of a variable frequency oscillator in accordance with the invention;

FIG. 6(a) is a circuit diagram of the counter circuit of FIG. 5;

FIGS. 7(a) and 7(b) illustrate recording formats of a disk;

FIG. 8 is a block diagram of a conventional variable frequency oscillator;

DESCRIPTION OF THE PREFERRED EMBODIMENTS

Figure 1:
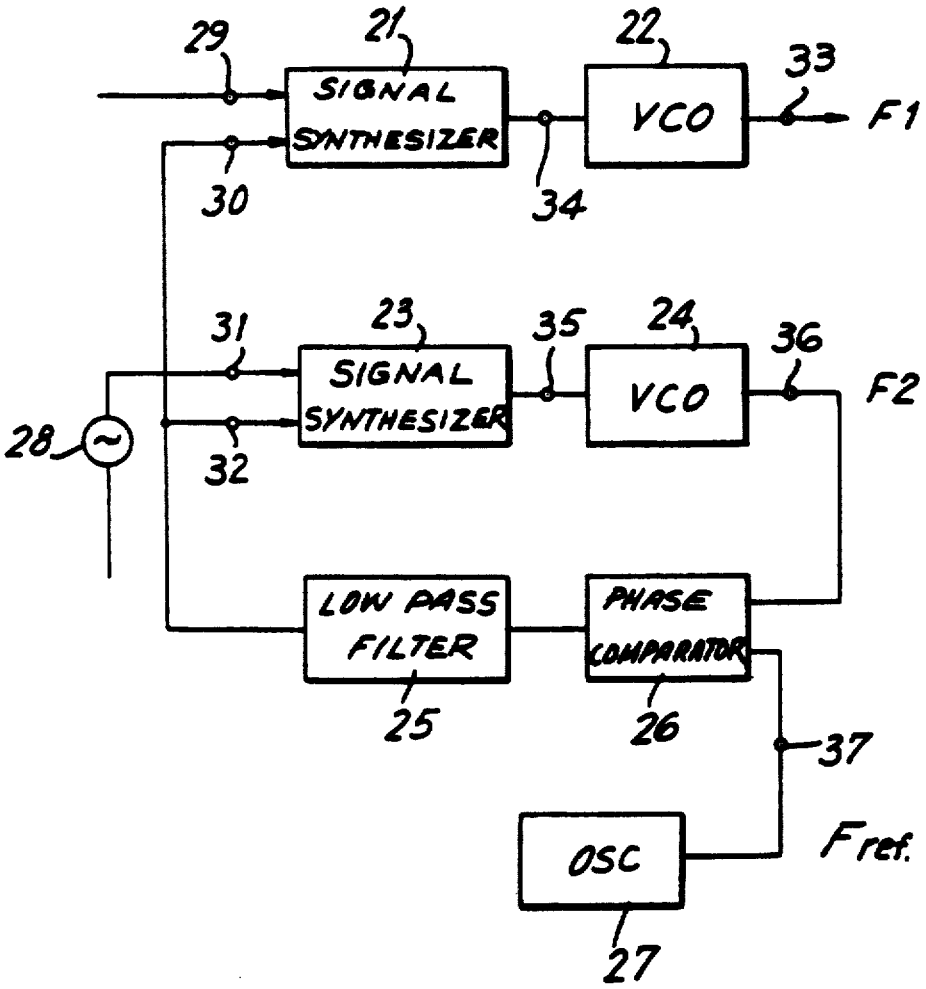
FIG. 1 is a block diagram of a variable frequency oscillator circuit in accordance with the invention.

FIG. 1, is a block diagram of a voltage-controlled oscillator circuit in accordance with the invention. The circuit includes signal synthesizing means 21 and 23 designed so as to have the same characteristics. Although voltage is treated in this circuit, other physical quantities such as current or electric charge can be similarly treated. The circuit 21 has a characteristic expressed by $$V_{01}=f(V_{11}, V_{21}) \quad (3)$$

where f is an arbitrary function when voltage $V_{11}$ and $V_{21}$ are applied to terminals 29 and 30, respectively, and the voltage $V_{01}$ appears at the output terminal 34 of the signal synthesizing means 21. For simplicity, the equation above is expanded as follows:

$$V_{01}=aV_{11}+bV_{21}+c \quad (4)$$

where a, b and c are constants.

Similarly, when voltage $V_{12}$ and $V_{22}$ are applied to terminals 31 and 32, respectively, and a voltage $V_{01}$ appears at output terminal 35 of the signal synthesizing means 23, it is assumed that the following relationship holds, $$V_{02}=aV_{12}+bV_{22}+c \quad (5)$$

The present circuit also includes a pair of voltage-controlled oscillator circuits 22 and 24 having the same characteristics. It is now assumed that the frequencies $F_1$ and $F_2$ of the output signals from their respective circuits 22 and 24 are expressed by $$F_1=Kv\cdot V_{01}+d \quad (6)$$

$$F_2=Kv\cdot V_{02}+d \quad (7)$$

where d is a constant.

Also included in the circuit are a phase comparator circuit 26 and an oscillator circuit 27, which generates a signal having a stable frequency like that from a crystal oscillator circuit. The comparator circuit 26 acts to compare in phase the output from the oscillator circuit 24 with the output signal from the oscillator circuit 27 and to deliver a signal whose frequency is proportional to the phase difference between the two signals. A low-pass filter 25 is inserted into the circuit to derive only a desired signal component from the output from the phase comparator circuit 26 in a conventional manner. The output from the filter 25 is inversely fed back to the second input terminal 32 of the second signal synthesizing circuit 23. That is, the second VCO 24, comparator circuit 26, filter 25 and synthesizing means 23 forms a phaselocked loop. Thus the oscillation frequency of the second VCO 24 is made equal to the oscillation frequency $f_{ref}$ of the oscillator circuit 27. It is possible to cause the frequency of the output from the VCO 24 to entirely agree, even in phase, with the frequency $f_{ref}$ by virtue of the characteristics of the comparator circuit 26 and the filter 25. Alternatively, the frequency F2 may be caused not to respond to a sudden change in the frequency $f_{ref}$. Since a circuit oscillating with sufficient stability is used for the oscillator circuit 27 in a conventional manner, making the response of the system more rapid introduces no problem. Also, because the output frequency of the oscillator 24 need be in step with the frequency $f_{ref}$ only in frequency, and presence of error in phase is allowed, a considerable degree of freedom is given to the circuit configuration. If the oscillator circuit 27 does not operate stably and jitter or the like takes place, the system can be so designed that it is less affected thereby.

When the free-running frequency of the voltage-controlled oscillator circuit 24 varies due to variation in the power supply voltage, temperature characteristics, again or the like, the system automatically increases or decreases the voltage applied to the terminal 32 to maintain the oscillation frequency of the VCO 24 at $f_{ref}$. Also, in a case where an arbitrary value of voltage from a source 28 is applied to the first control terminal 31 of the second signal synthesizing means 23, the voltage applied to the terminal 32 is automatically controlled so that the oscillation frequency of the second VCO is kept at $f_{ref}$, irrespective of the value of the applied voltage.

Thus, when a reference voltage $V_s$ is applied to the first input terminal 31 of the second signal synthesizing circuit 23, the level of voltage applied to the second input terminal 32 is automatically adjusted such that the oscillation frequency of the VCO 24 is made equal to $f_{ref}$. In a situation where the voltage applied to the second input terminal 32 of the second signal synthesizing means 23 is also fed to the second input terminal 30 of the first signal synthesizing means 21 as shown in FIG. 1, the frequency of oscillation of the first VCO 22 is set to $f_{ref}$ when the voltage applied to the first input terminal 29 of the first means 21 is $V_s$, because the first signal synthesizing means 21 and the first VCO 22 have the same characteristics as the second signal synthesizing means 23 and the second VCO 24, respectively. When the voltage applied to the terminal 29 is $V_s$, frequency of oscillation of the VCO 22 assumes a value of $f_c$, if the frequency $f_{ref}$ is set to a desired free-running frequency $f_c$. Therefore, a voltage-controlled circuit whose free-running frequency is $f_c$ is provided by using the terminals 29 and 33 as the control terminal and the output terminal, respectively, of the whole circuit of FIG. 1.

The novel circuit has been described thus far on the assumption that the signal synthesizing means 21 and the VCO 22 have the same characteristics as the means 23 and the VCO 24, respectively. This assumption is quite reasonable. Particularly when the circuit is formed into a monolithic integrated circuit, each pair of elements can be accurately symmetrically fabricated on a chip, a few millimeters in each dimension. Since the components are fabricated at the same time, even if they experience aging, their characteristics change in the same manner with time and so it is unlikely that the characteristics come to differ widely from each other. Further, because each pair of components is supplied with electric power from the same power supply and because they are disposed in close proximity, variation in temperature from component to component is minimum and the possibility that their *predetermined* characteristics come to differ widely from each other is also small in this respect. In making designs for the integrated circuit, if the symmetry of each pair of components considered fully so that variations in the characteristics may cancel each other, then a stable voltage-controlled oscillator circuit can be obtained which is not accompanied by large drift.

Figure 2:
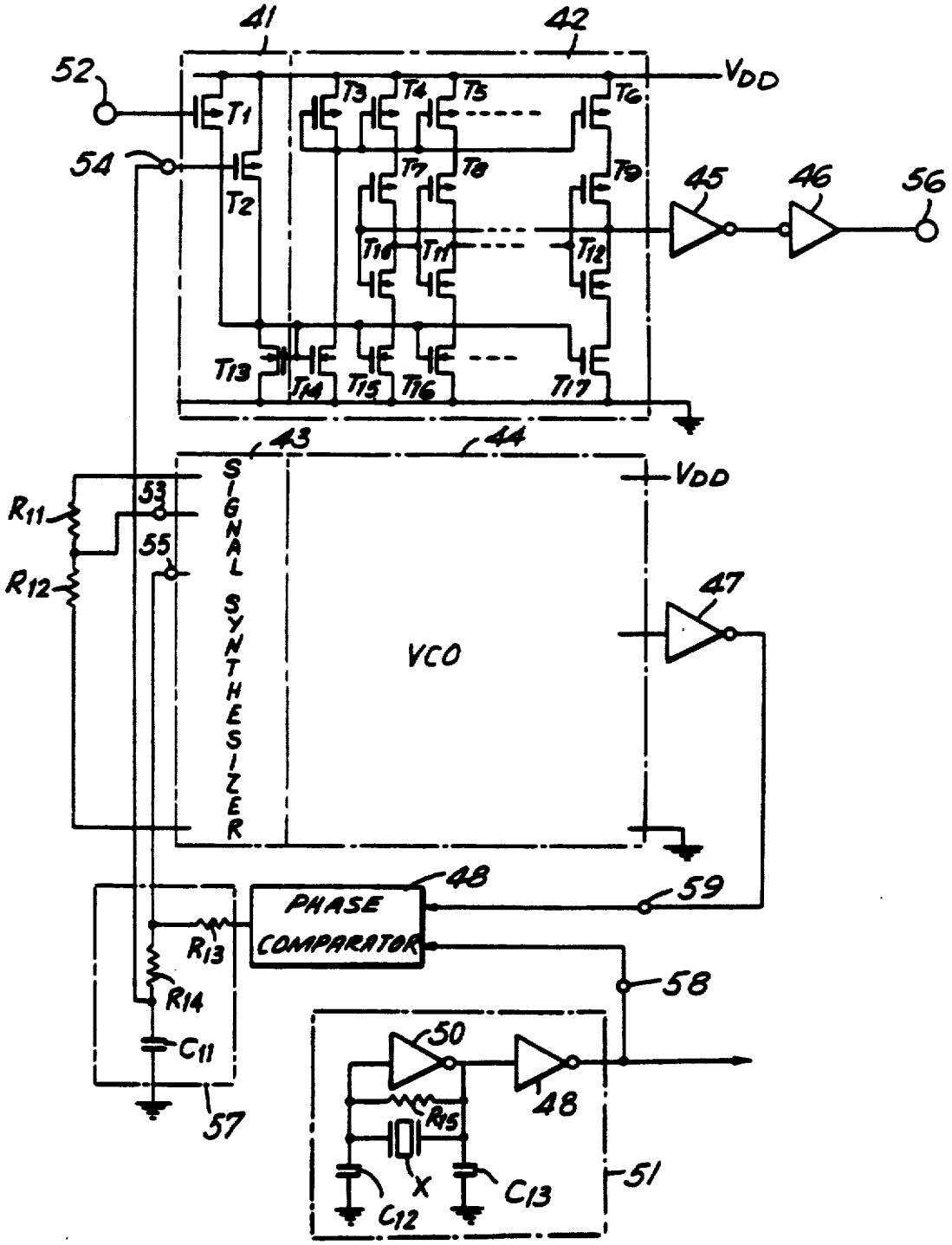
FIG. 2 is a variable frequency oscillator circuit in accordance with the invention.

Referring next to FIG. 2, a more specific example of a voltage-controlled oscillator circuit in the form of a semiconductor integrated circuit, fabricated on the concept described above, is shown. A signal synthesizing circuit 41 has transistors $T_1$ and $T_2$ whose drain currents are changed by changing the gate voltages of the transistors. The drain currents of the transistors $T_1$ and $T_2$ are combined into one and caused to flow into a transistor $T_{13}$, in which the current is converted into a voltage drop. This voltage is applied to a first voltage-controlled oscillator circuit 42 consisting of a MOS transistor as its control voltage.

This circuit includes an odd number of inverter stages made up of transistors $T_7$, $T_{10}$, $T_8$, $T_{11}$, . . . $T_9$, $T_{12}$ to form ring oscillators. Other transistors $T_4$, $T_5$, $T_6$, . . . $T_{15}$, $T_{16}$, $T_{17}$ are connected in series with the sources of the former transistors, and the gate voltage of the latter transistors are controlled to control the current supplied to the ring oscillators from the power supply for exerting control over the frequency of oscillation. In the example, as the voltages at terminals 52 and 54 decrease, the drain voltage of transistor $T_{13}$, that is, the control voltage of the VCO 42, increases, resulting in an increase in frequency of oscillation. This is the case where a and b are negative in equation (4) and $K_v$ is positive in equation (6). The present circuit also includes buffer circuits 45 and 46 to deliver an output at terminal 56.

When the voltage levels at the terminals 52 and 54 are high, if a high frequency of oscillation is desired, then polarities of the transistors in the circuits 41 and 42 in an alternative embodiment are reversed, that is, a P-channel transistor is changed to an N-channel transistor and vice versa, such that a,b and $K_v$ assume negative values. The signal synthesizing circuit 43 and the voltage-controlled oscillator circuit 44 have the same circuit configurations as the circuits 41 and 42, respectively. Having the same internal constructions, the details of each of the circuits 43 and 44 is not shown in FIG. 2. The output from the second VCO 44 is applied to a phase comparator circuit 48 through a buffer 47. A crystal oscillator circuit 51 generates a frequency signal $f_{ref}(=f_c)$, that is used as a standard for the free-running frequency. Usually, this signal is applied to the phase comparator circuit 48, in which it is compared in phase with the output of the second VCO 44. This signal generated by the oscillator 51 is used together with timing clock signals for other circuits, a clock signal for the system, or the like. If the frequency of clock signals necessary for another circuit differs from $f_c$, then frequency divider circuits or frequency converter circuits can be connected to both or one of nodes 58 and 59 to set the frequency $f_c$ to a frequency an integer times the frequency of oscillation of the oscillator circuit 51 or to the frequency of oscillation divided by an integer, or to the difference between those frequencies or to the frequency of oscillation multiplied by a rational fraction. Any frequency divider circuit or frequency converter circuit can be comprised of a digital circuit and no difficulty is introduced in forming it into a semiconductor integrated circuit.

A low-pass filter 57 removes the high frequency components contained in the output from the phase comparator circuit 48, and the output from the filter 57 is fed back to a second input terminal 55 of the second signal synthesizing circuit 43. Resistors $R_{11}$ and $R_{12}$ are connected to a first input terminal 53 to obtain a fraction of the voltage of the power supply so that an input signal level or reference level sufficient to allow oscillation at frequency $f_c$ is provided. Although it is difficult to form resistors having accurate values in a semiconductor integrated circuit, the relative accuracy among those values can be enhanced greatly. It is also possible to connect a more accurate voltage source, such as a reference voltage source using zener diodes, to this terminal. The second input terminals 54 and 55 of the first and second signal synthesizing circuits 41, 43 are connected to different points on opposite sides of a resistor $R_{14}$ inside the filter 57. This resistor serves to stabilize the PLL, in essentially the same manner as in the case of FIG. 1.

The configuration of FIG. 2 consists entirely of MOS transistors other than resistors $R_{11}$–$R_{15}$, capacitors $C_{11}$–$C_{13}$ and crystal oscillator X. Absolute accuracy is not required for the resistors and capacitors. Therefore resistors can be incorporated into a semiconductor integrated circuit. Further, capacitor $C_{11}$ often can be incorporated into the integrated circuit, although it depends on the required range of oscillation frequency. When a low frequency is needed, a frequency divider circuit is connected to an output terminal 56 to allow an increase in the frequency of oscillation of the PLL. Hence, only a small value is necessary for capacitor $C_{11}$, with the result that forming the circuit into an integrated circuit is rendered easier.

As described above in accordance with the invention, a substantially stable voltage-controlled oscillator circuit can be fabricated without using accurately fabricated parts, which makes it quite easy to fabricate the oscillator circuit in the form of an integrated circuit. Thus, great advantages are provided in packaging the components and manufacturing the oscillator circuit.

Figure 3:
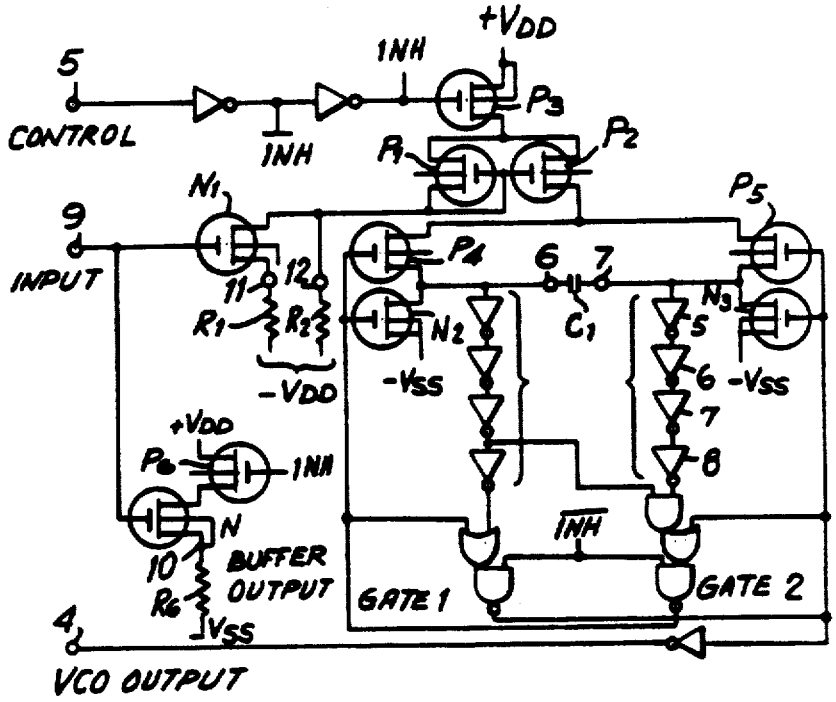
FIG. 3 PRIOR ART
FIG. 3 is a circuit diagram of a prior art voltagecontrolled oscillator circuit.
Figure 4:
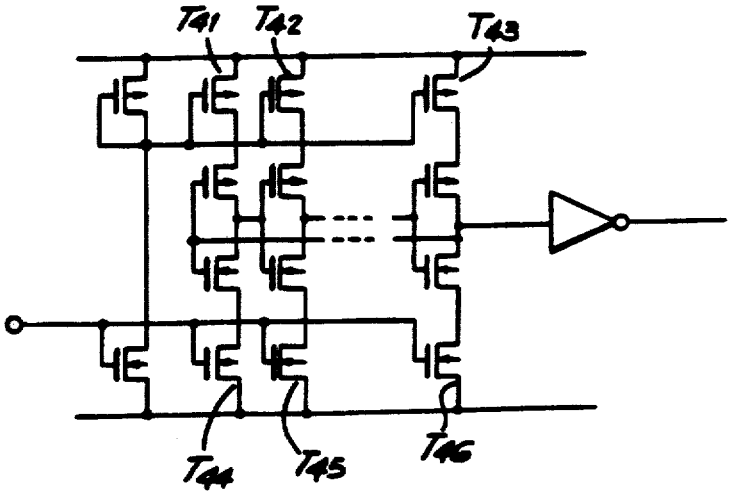
FIG. 4 PRIOR ART
FIG. 4 is a circuit diagram of another prior art voltagecontrolled oscillator circuit.

When the novel configurations shown in FIGS. 1 and 2 are compared with the prior art configurations shown in FIGS. 3 and 4, one might suppose that the novel constructions are considerably more complex than the prior art. In actuality, however, when the circuit of FIG. 2 is fabricated in a semiconductor integrated circuit, the area occupied by the circuit on the chip is small. On the other hand, the prior art configuration of FIG. 4 requires externally attached parts, which need large areas occupied by bonding pads on a semiconductor integrated circuit, and output transistors, for example, $P_4$, $P_5$, $N_2$, $N_3$ for driving externally attached capacitor $C_1$, and $P_1$, $N_1$ for driving externally attached resistors $R_1$, $R_2$. The area occupied by these parts is much greater than the area of the circuit of the invention.

The present invention requires a stable oscillator circuit like a crystal oscillator, but this introduces no problem, because large-scale integrated circuits frequently require stable reference pulse trains in addition to voltage-controlled oscillator circuits, and these pulse trains may also be used for that purpose. In addition, in the circuits of the invention, the free-running frequency can be set at discretion with the same circuit by connecting frequency divider circuits or frequency converter circuits in series with the node 36 to 37 of FIG. 1 or node 58 or 59 of FIG. 2 and controlling the factor of frequency division or other factors with logic circuits.

In this manner, a method for stabilizing a voltagecontrolled oscillator circuit, which can readily be formed into an integrated circuit, and a voltage-controlled oscillator circuit which can readily be incorporated into a digital integrated circuit have been disclosed. Practicing the present invention permits reduction in cost and packaging space, thus greatly contributing to the manufacturing of devices requiring such circuitry.

Now, a variable frequency oscillator, VFO, for producing precise data windows to separately derive clock bits and data bits from a signal read from a floppy disk is described. The VFO uses the concepts described above.

Before describing a conventional variable-frequency oscillator for floppy disks, formats for data writing on floppy disks and the functions for such an oscillator are described. Presently, an IBM format and similar formats are nearly exclusively used as formats for floppy disks. Therefore, these formats are described below.

Referring to FIGS. 7(a) and 8(b), there are shown a data pulse train and so on read from a floppy disk 8 inches in diameter by means of a floppy disk drive. FIG. 7(a) shows a single density (FM) recording on the disk. In this case, one clock pulse is admitted every 4 $\mu$s of 1 bit cell of he fetched data pulse train. A VFO produces data window waveforms as shown from the pulse train, and then the window waveforms are ANDed with the data pulse train to reproduce separate data pulses. FIG. 7(b) shows a double density (MFW) recording, in which only when neighboring bits or 0's is a clock pulse admitted. Also in this case, a VFO produces data window waveforms from the fetched pulse train, and then the window waveforms are ANDed with the data pulse train for reproduction of data. When a floppy disk 5 inches in diameter, called a mini-floppy, is used, the period of bit cells is twice that of an 8 inch floppy disk.

When the pulses of a data pulse train read from the floppy disk drive are located precisely in standard positions within bit cells as shown in FIGS. 7(a) and (b), data window waveforms can be produced by a one-shot multivibrator or the like with relative ease. In reality, however, there arises a possibility that each pulse is shifted from its standard position by about $\pm 350$ ns with an 8 inch standard floppy disk and $\pm 700$ ns with a mini-floppy at worst. This phenomenon is known as peak shift and is caused by interference between neighboring waveforms when data is read from a magnetic medium. A variable-frequency oscillator acts to produce correct data window waveforms from a fetched data pulse train accompanied by such peak shift and to derive only data pulses.

An example of a conventional variable-frequency oscillator is described in detail in "Interface", Jul., 1979, FIG. 8 shows such an oscillator in block diagram, in which data read from a floppy disk drive is applied to a terminal 401 and admitted to a phase comparator 404 through a one-shot multi-vibrator 403. A voltage-controlled oscillator 408 produces window waveforms to the phase comparator 404 through a gate circuit 410 for phase comparison with the output from the multivibrator 403. The output from the comparator 404 is fed to a first low-pass filter 406 or a second low-pass filter 407 via a switching circuit 405 to remove the high frequency components, and then the signal is fed to the voltage-controlled oscillator 408, so that the frequency of oscillation of the oscillator 408, that is, the frequency and phase of the window signal, is controlled by the phase difference between those signals. In particular, the phase comparator 404, filter 406 or 407 and VCO 408 form a phase-locked loop, and the circuit does not respond to rapid changes in data signals due to peak shift, the data signals being fetched for application to the terminal 401. Rather, it responds to slow changes and produces a signal which is synchronized with the input signal and the phase of which is always in step with that of the input signal.

The system includes both the first low-pass filter 406 responding quickly to its input signal or having a high cut-off frequency and the second low-pass filter 407 responding slowly to its input signal or having a low cut-off frequency. The two filters are alternatively used by the operation of the switching circuit 405 for the reason described hereinafter.

Every floppy disk has evenly spaced pulses, called sync fields, written in the head portions of sectors for synchronization. Therefore, no peak shift takes place in these fields. Thus, the first filter 406 responding quickly is used for the fields and a synchronization with sync bits is effected rapidly. Thereafter, when fields of recorded data are to be treated, the filter 406 is changed over to the filter 407, which responds slowly to its input signal, so that the system will not respond to changes in the intervals of pulses attributed to peak shift. The signal for the changeover operation can be supplied from the processor or floppy disk controller of the system using the floppy disk drive and is applied to a terminal 402.

Figure 9:
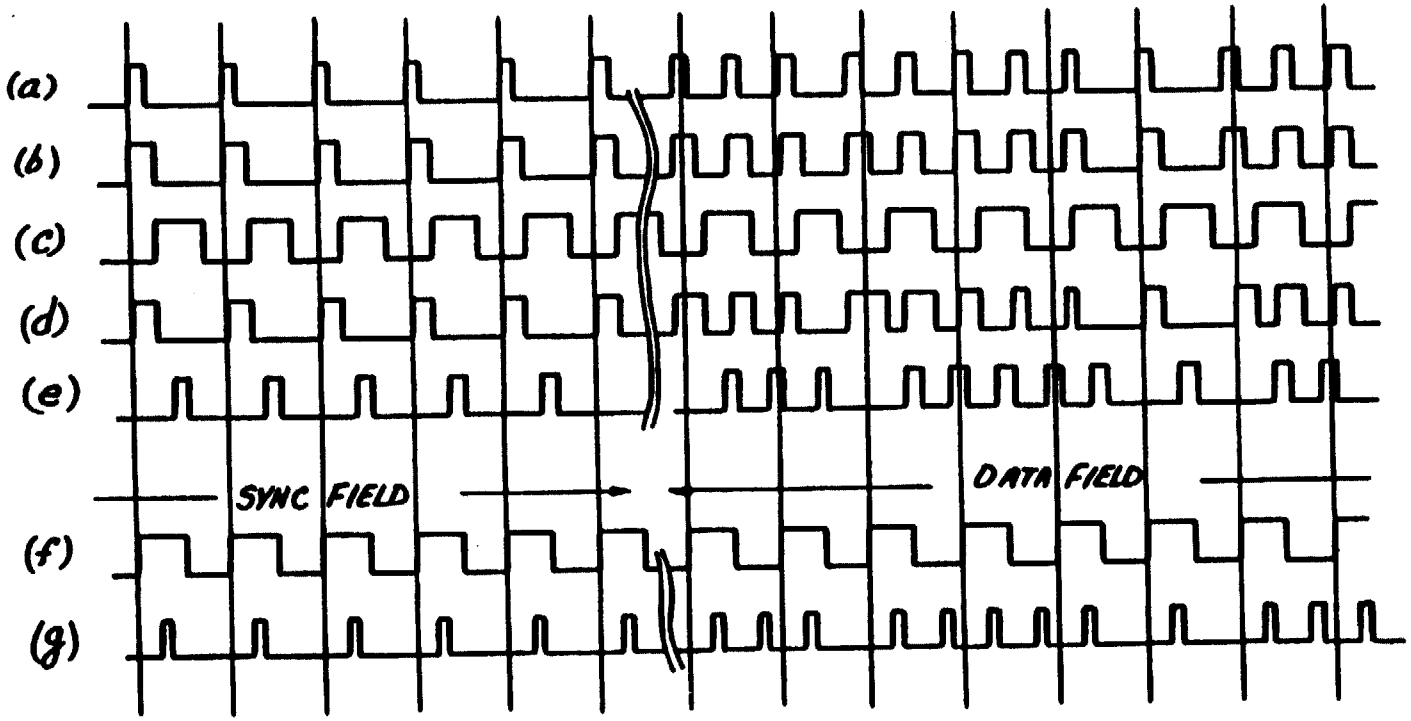
FIG. 9 is a time-chart for illustrating and comparing operation of the conventional oscillator and novel variable frequency oscillator in accordance with the invention.

Next, operations of the one-shot multivibrator 403, gate circuit 410 nd an output waveform shaping circuit 409 are described by referring to the time-chart of FIG. 9. The multivibrator 403 is triggered into action on each rising portion of data pulses (FIG. 9(a)) read from the floppy disk drive and delivers pulses having a pulse width that is one-fourth the duration of one bit cell (FIG. 9(b)). These pulses are applied to the phase comparator 404 at all times, and during sync fields they are compared in phase with window waveforms (FIG. 9(c)). The multivibrator 403 serves to adjust the timings of the associated signals such that each data pulse read by the floppy disk drive is brought to the center of each window. During data fields, the pulse interval between fetched waveforms sometimes becomes twice or half of the period of windows and so direct comparison between the output from the multivibrator 403 and the window waveforms is impossible. The gate circuit 410 acts to select the signal applied to the comparator 404 based on the sync field signal fed to the terminal 402 and consists of a switch and a flip-flop which is set on the rising portion of each data pulse as shown in FIG. 9(d), and is reset on the transition points of each window waveform (FIG. 9(c)). This determines the leading edge and trailing edge of each pulse. The switch allows the output signal from the flip-flop to be applied to the comparator 404 during data field periods. In this way, during these periods, the waveforms of FIG. 9(b) are compared in phase with each falling porting of the waveforms of FIG. 9(d) to prevent occurrence of comparison error due to missing pulses. The output waveform shaping circuit brings each fetched pulse to the center of each window, moves the pulses and shapes them, so that the circuit delivers waveforms as shown in FIG. 9(c). The shaping circuit is made up of a delay circuit such as a one-shot multivibrator.

Figure 10:
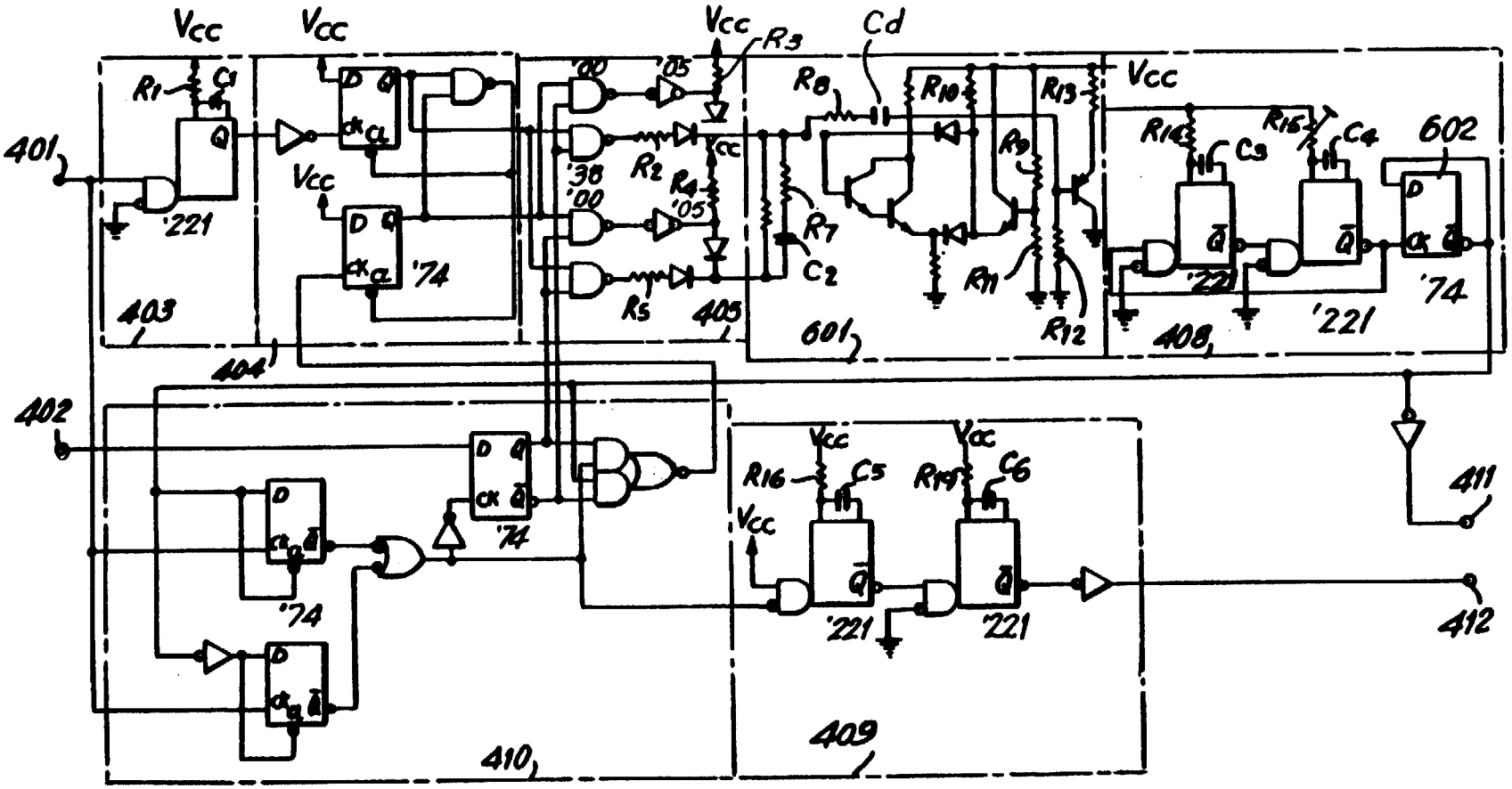
FIG. 10 is a detailed circuit diagram of the oscillator of FIG. 8.

Referring next to FIG. 10, a conventional variable-frequency oscillator shown in FIG. 8 in block diagram is shown in detail. The blocks surrounded by phantom lines are denoted by the same reference numerals as those of FIG. 8 except for a low-pass filter 601 which does not possess entirely individual circuits to have both rapid and slow responses, but rather a portion is used in common for the rapid and slow operations in this filter.

The conventional variable-frequency oscillator has some disadvantages. First, it is difficult to fabricate the oscillator in the form of a semiconductor integrated circuit as can be seen from FIG. 10. The circuit of FIG. 10 requires 19 resistors and 6 capacitors as discrete components. It is possible even with prior art techniques to fabricate these components on one chip by attaching discrete components to the outside surface of the chip and fabricating the other components in a semiconductor integrated circuit form. However, features inherent in semiconductor integrated circuitry cannot be fully achieved from such a construction. Specifically, the space to mount components cannot be made small. Also, a large number of junction points do not assure good reliability. The number of steps for mounting components and the cost of fabricating the circuit cannot be reduced. Thus a considerable limitation is imposed on the design of such a chip for a semiconductor integrated circuit.

In particular, when connections are made to externally attached components from the inside of the semiconductor integrated circuit chip, a considerably larger chip area is needed as compared with a construction where no connections are required, because pads for connection, and transistors in the outer buffer circuits are several ten-times as large as those of a device dispensing with external connections. Furthermore, the cost of packaging for the integrated circuit is increased.

Another disadvantage of the prior art circuit is that adjustments are necessary after assembly. This is caused by the fact that stable and precise variable-frequency oscillators are not available.

Referring now to FIG. 5, there is shown in block diagram a variable-frequency oscillator embodying the concept of the invention. The oscillator includes a counter circuit 101, crystal oscillator 102, phase comparator 104, switching circuit 105, low-pass filters 106, 107, an adder 108, phase-shift circuit 110, a differentiating circuit 111, a frequency divider circuit 112, a second phase comparator circuit 114 and a second adder 116. The counter circuit 101 is set by the leading edge of each data pulse, which is read from a floppy disk drive (not shown) and applied to a terminal 119, and counts the pulses generated by the crystal oscillator 102 until a certain count is reached, whereupon the counter 101 is reset and delivers a pulse. The switching circuit 105 selects one of the filters 106, 107 depending on whether a sync field data signal or data field signal is applied to a terminal 120. The filters have different passbands, and when the sync field signal is to be passed, the filter 106 having a broader passband is selected.

The adder 108 forms the sum of the output from either the first filter 106 or the second filter 107 and the output from a third low-pass filter 115 and applies it to the control terminal of a voltage-controlled oscillator 109 to control the frequency of oscillation of the oscillator 109. The differentiating circuit 111 produces a narrow pulse when the trailing edge of the signal from a gate circuit 103 reaches. The second adder 116 has the same characteristics as the adder 108 and adds a reference voltage $V_r$ generated by a reference voltage source 117 to the output from the third filter 115 to control a second voltage-controlled oscillator 118, which is designed so as to have the same characteristics as the first oscillator 109. The novel configuration is comprised of a first phase-locked loop, which contains the phase comparator 104, first filter 106 or second filter 107 and the first voltagecontrolled oscillator 109, and a second phase-locked loop, which contains the second phase comparator 114, third filter 115 and second voltage-controlled oscillator 118.

In the operation of the oscillator constructed as described above, the second phase-locked loop is locked in step with the output frequency divider circuit 112, which divides the output frequency of the crystal oscillator 102 down into a lower frequency and delivers a signal at the free-running frequency needed by the first voltage-controlled oscillator 109. Of course, in a state where the second loop is locked, the frequency of one input signal to the comparator 114 is equal to that of the other signal and the phase difference between the two signals is kept constant. In other words, as described with reference to FIGS. 1 and 2 the second voltage-controlled oscillator (VCO) also oscillates at the free-running frequency. Even if the constants of the second VCO vary due to changes in the power supply voltage or ambient temperature, aging, scatter in the constants of the components or other factor, the output from the third filter is controlled so that the second VCO 118 always oscillates at the free-running frequency by virtue of the action of the negative feedback loop.

When the reference voltage $V_r'$ for example half of the power supply voltage, is applied to one input terminal of the second adder 116 and the output from the third filter 115 is applied to one input terminal of the first adder 108 as shown in FIG. 5, the first VCO 109 should oscillate at the free-running frequency at the time the output from the first filter 106 or second filter 107 equals the reference voltage $V_r$. As long as the adders and the VCOs 109, 118 are symmetrical accurately, respectively, a voltage-controlled oscillator entirely free from drift and initial deviation can be attained even if such VCOs are employed that could otherwise not be put into practical use due to their instability. This oscillator oscillates at the free-running frequency when a control voltage $V_r$ is applied. The configuration described so far can stabilize the operation of the VCO 109 in the first PLL.

Referring next to FIG. 6(a), the counter circuit 101 is shown in detail. This circuit 101 receives a fetched data pulse train (FIG. 9(a)) and delivers pulses whose pulse width is onefourth of the duration of 1 bit cell (FIG. 9(b)). That is, flipflops 202, 203 and a gate 204 produce a short pulse to reset a frequency divider circuit 201 and set a flip-flop 205 on the leading edge of each fetched data pulse which is applied to a terminal 206. A terminal 208 is connected to the crystal oscillator 102 whose output frequency is divided down into a lower frequency by the divider circuit 201. When the circuit 201 receives pulses of the lower frequency, it delivers a carrier to set the flip-flop 205.

The configuration described thus far offers a one-shot multivibrator stably producing pulses having an accurate pulse width. Also, as can be understood by comparison with the prior art oscillator FIG. 6, the novel configuration does not require resistor $R_1$ and capacitor $C_1$. The output from the counter circuit 101 is applied to the phase comparator 104, and it is compared in phase with the output waveform (FIG. 9(c)) from the VCO 109 and with the waveform (FIG. 9(d)) during sync field and data field periods, respectively, by the action of the gate circuit 103. The resultant phase difference signal is supplied by the action of switching circuit 105 to the first low-pass filter 106 responding quickly during sync field periods and to the second filter 107 responding slowly during data field periods to filter out unwanted high frequency components. The output from either filter is applied to the adder 108 to control the frequency of oscillation of the VCO 109. The other input to the adder 108 comes from the second PLL, and causes the VCO 109 to oscillate at the free-running frequency when the output from the first filter 106 or second filter 107 is $V_r$ as described previously.

The output voltage from the filter 106 or 107 assumes a value of $V_r$ under steady state by making the free-running frequency equal to the window frequency. The absolute value of the current flowing into, or out of, the low-pass filter can be invariably kept constant by setting the voltage $V_r$ to the average value of the output voltage derived when the output from the comparator 104 assumes a logic high state and the output voltage derived when the output from the comparator 104 assumes a logic high state and the output voltage derived when the output from the comparator 104 assumes a logic low state. Further, since the output from the filter can be brought quite close to the voltage $V_r$ under steady state, use of a charge pumping circuit connected to the output of the comparator 104 dispenses with active filters. This makes it very easy to fabricate the oscillator in the form of an integrated circuit. The output rom the VCO 109 is fed back to the comparator 104 via the gate circuit 103 to form a loop. Thus, stable and precise windows can be formed.

In the conventional device, a one-shot multivibrator is used as the output waveform shaping circuit 409 to delay each waveform of FIG. 9(d) so that each pulse is moved to the center of each window (FIG. 9(C)). The embodiment of the invention shapes waveforms in a different manner from this. In particular, the differentiating circuit 111 produces short pulses (FIG. 9(g)) on the trailing edge of each waveform of FIG. 9(d) and can easily be fabricated by including the flip-lops 202, 203 and the gate 204 of FIG. 6(a). The fetched data pulse train takes the waveform of FIG. 9(g) although the pulse train was not passed through a delay circuit, thus dispensing with resistors $R_{16}$, $R_{17}$ and capacitors $C_5$, $C_6$ required in the shaping circuit 409 shown in FIG. 10. In the circuits in accordance with the invention, as each fetched data pulse (FIG. 9(g)) is brought to the center of each window, the phase-shift circuit 110 shifts the phase of the windows by an angle of 90 degrees or 270 degrees (FIG. 9(f)). This phase shift circuit can be readily constructed by forming a ½ frequency divider circuit using a master-slave flip-flop, because the phases of the output waveforms of the master and slave flip-flops are 90 degrees out-of-phase. In the conventional deice of FIG. 10, a ½ frequency divider circuit 602 is incorporated into the VCO 408 to set the duty cycle of the output waveforms to 50%. The waveforms of FIG. 9(c) and (f) can be readily obtained by feeding the output from the master flip-flop back to the gate circuit 103 and supplying the inverted output of the slave flip-flop to the terminal 121.

All components of the novel device except for the low-pass filters 106, 107, 115, adders 108, 116, reference voltage source 117, VCOs 109 and 118 and crystal oscillator can be made of digital circuits. Further, no part, externally attached to that semiconductor integrated circuit, is required. In addition, VCOs per se do not need high accuracy of stability as described above.

Figure 6B:
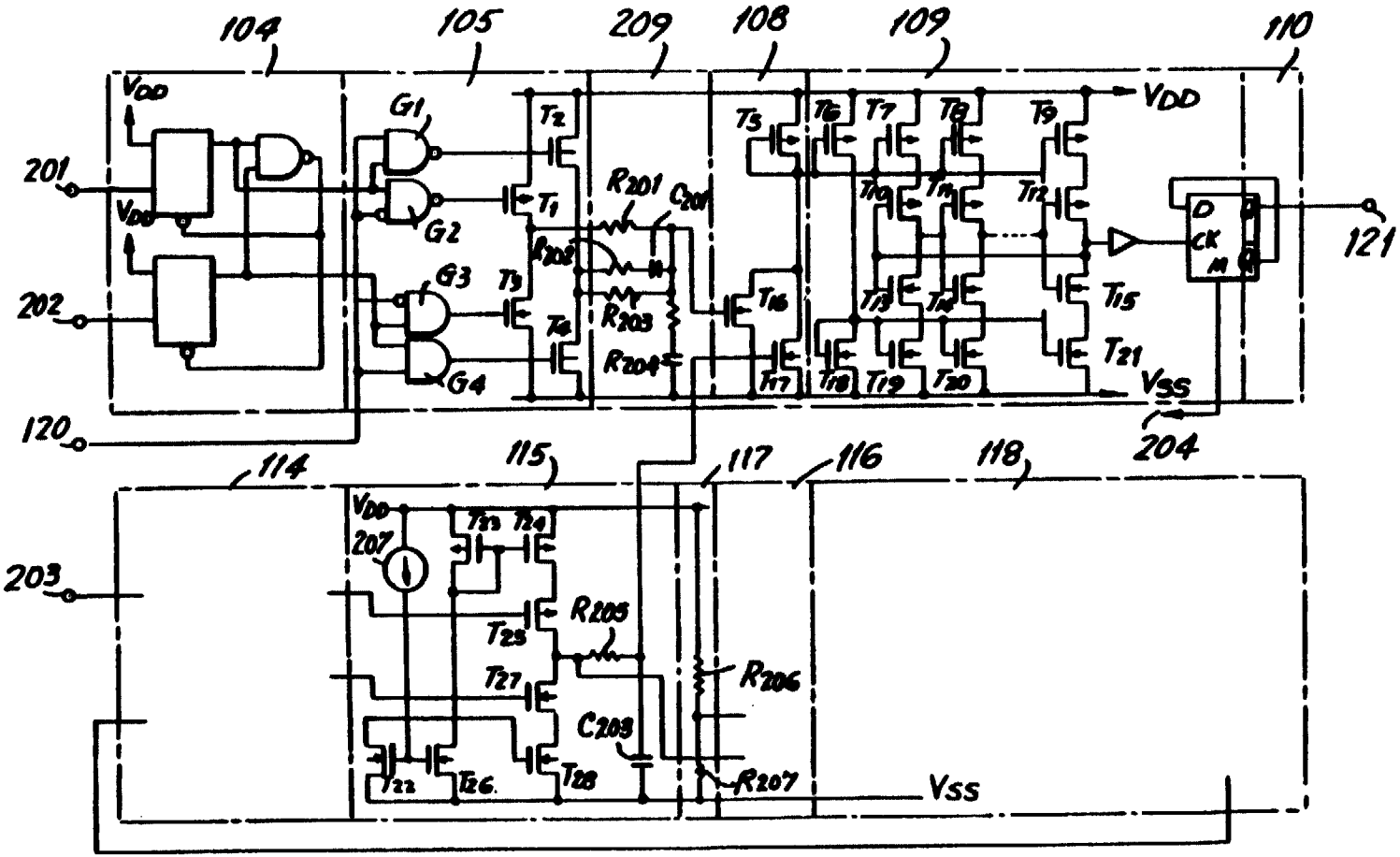
FIG. 6(b) illustrates several components of FIG. 5 in detail.

The circuit stages beginning from the phase comparator 104 and ending with the VCO 109, as well as the circuit stages beginning from the phase comparator 114 and ending with the VCO 118, can be made simpler and can be fabricated in the form of an integrated circuit in accordance with the teachings of the invention as described hereinbelow. Referring to FIG. 6(b), the phase comparators 104, 114, switching circuit 105, low-pass filters 106, 107, 115, adders 108, 116, VCOs 109, 118 and phase-shift circuit 110 are shown in detail. The blocks surrounded by phantom lines are denoted by the same reference numerals as the components of FIG. 5 for correspondence to them except that a low-pass filter 209 corresponds to both filters 106, 107. The filter 209 includes a portion equivalent to the portion common to both filters 106, 107. Also, because the phase-shift circuit 110 can be attained only by the slave flip-flop of the circuit 205 in the VCO 109 as already described, the flip-flop 205 is divided into two by a phantom line. Since the phase comparator 114 and the adder 116 have exactly the same internal configurations as the comparator 104 and the adder 108, respectively, their details are not shown in FIG. 6b. Also, as the VCO 118 is the same as the combination of the VCO 109 and the phase-shift circuit 110, its details are not shown.

Terminals 201, 202, 203 and 204 are connected to the counter circuit 101, gate circuit 103, frequency divider circuit 112 and one input of the gate circuit 103, respectively. The combination of AND gates $G_1$ and $G_2$ to which transistors $T_1$ and $T_2$ are connected and the combination of AND gates $G_3$ and $G_4$ to which transistors $T_3$ and $T_4$ are connected are alternatively enabled, depending on whether a snyc field signal or data field signal is applied to a terminal 120. This causes the combination of the transistors $T_1$ and $T_2$ and the combination of the transistors $T_3$ and $T_4$ to selectively conduct, whereby the phase difference signal is alternatively transmitted to a quick response low-pass filter consisting of resistors $R_{201}'$ $R_{204}$ and a capacitor $C_{202}$ and a slow response low-pass filter consisting of resistors $R_{202}$, $R_{203}$, $R_{204}$ and capacitors $C_{201}'$ $C_{202}'$. The drain currents of transistors $T_{16}$ and $T_{17}$ are summed up in added circuits 116, 108, and then the resultant current is converted into a voltage by a transistor $T_5$ to control the VCO 109. If transistors $T_5$, $T_6$, $T_7$, $T_8$, . . . $T_9$, $T_{18}$, $T_{19}$, $T_{20}$, . . . $T_{21}$ have the same constants, then their drain current will be equal to that of the transistor $T_5$ in saturation region. In other words, the drain current of these transistors can be controlled by the gate voltage of the transistors $T_{16}$ and $T_{17}$. Transistors $T_{10}$, $T_{13}$, $T_{11}$, $T_{14}$, . . . $T_{12}$, $T_{15}$ constitute inverters and their odd-numbered stages are connected together to form ring oscillators whose frequency of oscillation is controlled as the current fed to them is controlled by the gate voltage of the transistors $T_{16}$ and $T_{17}$. For this purpose, transistors limiting current are connected to the sources of those transistors. The output of the ring oscillators is fed to the flip-flop 205 via a buffer 206, so that the frequency is halved and the duty cycle is modified. No additional phase-shift circuit is required by utilizing output 204 of the master flip-flop of the circuit 205. Since the VCO 109 is stabilized in the manner described previously, it is assured that even ring oscillators whose instability could otherwise not be accepted, can be employed. The ring oscillators can be made simply by connecting an odd number of inverter stages to one another, and the ring oscillators do not have parts, such as capacitors, which are required to be externally attached to the semiconductor integrated circuit. Therefore they are quite easy to fabricate in the form of a semiconductor circuit.

A reference voltage source 117 has resistors $R_{206}$ and $R_{207}$ for dividing the power supply voltage down to a reference voltage. If the relative accuracy between the resistances of both resistors is good, the derived voltage will accurately be a desired fraction of the power voltage, thereby the resistors are easy to incorporate into a semi-conductor integrated circuit. Of course, a voltage generated using zener diodes or the like can also be used.

Indicated by numeral 115 is the third low-pass filter. The current $I_o$ of a current source 207 is converted into a voltage by a transistor $T_{22}$ to control the gate voltages of transistors $T_{26}$, $T_{28}$ for limiting the channel currents of the transistors $T_{26}$, $T_{28}$, When the transistors $T_{22}$, $T_{26}$ and $T_{28}$ have he same constants, the currents will be limited to $I_o$. A transistor $T_{23}$ converts the current $I_o$ to a voltage to limit the channel current of a transistor $T_{24}$. If transistors $T_{25}$, $T_{23}$, $T_{24}$ have the same constants, then the currents will also be limited to $I_o$. Transistors $T_{25}$ and $T_{27}$ form a switch called a charge pumping circuit which has the same function as the combination of the transistors $T_1$ and $T_3$ and the combination of the transistors $T_2$ and $T_4$ in the switching circuit 105. The phase difference signal from the comparator 114 causes a capacitor $C_{203}$ to be charged or discharged to control the voltage applied to the second adder 116. As a result, the output phase of the VCO 118 is advanced or retarded.

The low-pass filter 115 consists of the current-limiting transistor $T_{24}$ or $T_{28}$, the resistor $R_{205}$ and the capacitor $C_{203}$. Because of currents of the transistors $T_{24}$ and $T_{28}$ are limited to $I_o$, the quantity of charge conveyed from the transistor $T_{25}$ to $T_{27}$ to the resistor $R_{205}$ and the capacitor $C_{203}$ is not affected by changes in the potential across the terminals of the capacitor $C_{203}$, that is, the input voltage of the adder 116. That is, the potential across the capacitor $C_{203}$ can be varied substantially due to changes in constants of the VCO 118, but changes in the response constant or the like of the second PLL caused thereby is held down to a minimum.

It will be noted by comparing FIG. 5 with FIG. 6(b) that the points from which signals are derived for application to the first and second adders 108 and 116, respectively, are different from each other. The resistor $R_{205}$ is inserted to stabilize the operation of the second PLL and so this resistor can be neglected when the circuit of FIG. 6(b) is discussed in principle. As such, the two points may be deemed to be the same.

It is to be understood that nearly all components of FIG. 6(b) can be fabricated in the form of a complementary MOS integrated circuits. Of course, bipolar or other semiconductor devices may be used with equal utility. The remaining 7 resistors and 3 capacitors are also incorporated into an integrated circuit int he following fashion. First, the resistors $R_{206}$ and $R_{207}$ can be incorporated into the integrated circuit only if their resistances have a sufficient relative accuracy. The accuracy required for the capacitor $C_{203}$ and the resistor $R_{205}$ is considerably low, and so these elements are also capable of being incorporated into the integrated circuit. Likewise, the accuracy necessary for the resistors and capacitors in the filter 209 is not very high. Hence these elements also can be incorporated into the integrated circuit. However, the constant of the filter must be varied depending on the kind, that is, the dimensions and so on, of the connected floppy disk. Therefore it may be desired that they are attached to the integrated circuit externally.

The oscillation frequency of each of the VCOs 109, 118 can be increased by the reciprocal of the frequency division factor of a frequency divider circuit connected to the terminal 113 of FIG. 5, and the time constant of the third filter 115 can be reduced by connecting all or a portion of the frequency divider circuit 112 in series with the terminal 113 and connecting the crystal oscillator 102 directly or the remaining portion of the divider circuit 112 with the second phase comparator 114. This permits miniaturization of the capacitor $C_{203}$, resistor $R_{205}$ and other elements, whereby the present circuit can be fabricated in the form of an integrated circuit with greater ease.

The novel circuit requires an expensive and stable oscillator circuit, such as the crystal oscillator 102. The conventional circuit does not need such an oscillator circuit when data are read by the floppy disk drive, but needs it when data are written. In practicing the present invention, the crystal oscillator used for reading operation can also be used for writing operation and, consequently, neither complication of the configuration nor increase in the manufacturing cost is introduced, thus resulting in no problem.

One might suppose that the novel circuit is made more complex than the conventional circuit and that manufacturing cost is increased by the addition of the second PLL. In fact, however, the opposite is the case. Since externally attached parts are reduced substantially, the area occupied by bonding pads for access to the integrated circuit, as well as the area required for buffer transistors connected to the input and output, can be reduced to a great extent. These components occupy a major portion of a semiconductor integrated circuit, and the area occupied by them is usually considerably larger than the whole area of the second PLL. Therefore, the invention can reduce the cost to fabricate ICs. The substantial reduction in the number of externally attached parts further permits a decrease in the cost of parts, assembly cost and the packing space and provides for an increase in reliability. Furthermore, VCOs dispense with adjustments during assembly operation because the free-running frequency is adjusted automatically.

As described above, in accordance with the present invention, addition of the second PLL permits stabilization of components including VCOs and so accurately fabricated components are not required. Therefore the components can be fabricated in the form of a semiconductor integrated circuit with great ease. Also, the circuit can be fabricated in the form of a digital circuit by making best use of the reference frequency signal generated by the crystal oscillator and replacing the conventionally used one-shot multivibrator with a counter circuit. The result is that the circuit is made more accurate and the number of components is reduced.

A variable-frequency oscillator circuit embodying the concept of the present invention can be formed into a semiconductor integrated circuit to a greater extent than the conventional circuit, thus permitting simplification of design of instruments and apparatuses, increase in reliability of apparatuses, decrease in the number of steps for assembly, miniaturization of apparatuses and reduction in the manufacturing cost. Thus, the invention offers innumerable advantages.

It is to be noted that the present invention can find application in variable-frequency oscillators for hard disks and other phase-locked loops in the form of semiconductor integrated circuit.

It will thus be seen that the objects set forth above among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A voltage-controlled oscillator circuit comprising:

first signal synthesizing means having first and second terminals receiving respective signals, and first synthesizing means combining said signals into one signal and delivering said combined signal;

second signal synthesizing means having the same characteristics as said first synthesizing means and having a first input terminal receiving a reference level signal and a second terminal;

a first oscillator circuit whose frequency of oscillation is controlled by said combined signal from said first synthesizing means;

a second oscillator circuit having the same characteristics as said *first* oscillator circuit and controlled by a signal from said second synthesizing means; and means for generating a reference frequency signal, an output from said second oscillator circuit being compared in phase with said reference frequency signal by phase comparison means, the resultant signal being applied to said second terminal of said second synthesizing means to control the output frequency of said second oscillator circuit, said resultant signal also being applied to said second terminal of said fist synthesizing means, said first input terminal of said first synthesizing means acting as the control terminal of said voltage-controlled oscillator circuit, the output of said first oscillator circuit acting as the output of said voltage-controlled oscillator circuit.

2. A voltage-controlled oscillator circuit comprising:

a first signal synthesizing circuit for receiving two signals and producing a signal based on these signals, one of the two signals being an external signal;

a first voltage-controlled oscillator connected to the output of said first synthesizing circuit, a phase-locked loop consisting of a second signal synthesizing circuit, a second voltage-controlled oscillator and a phase comparator; and an oscillator generating a signal of a stable frequency, said second signal synthesizing circuit having the same characteristics as said first synthesizing circuit, said second voltage-controlled oscillator being connected to the output of said second synthesizing circuit and having the same characteristics as said first voltage-controlled oscillator, one input of said phase comparator being connected to the output of said second voltagecontrolled oscillator, the other input of said comparator being connected to said oscillator, the output of said comparator being connected to one input of said first synthesizing circuit, which does not receive an external signal and to one input of said second synthesizing circuit.

3. A voltage-controlled oscillator circuit as claimed in claim 2, and further comprising means for supplying a reference signal to second input of said second synthesizing circuit.

4. A voltage-controlled oscillator circuit as claimed in claim 2, wherein said stable frequency oscillator is a crystal oscillator.

5. A voltage-controlled oscillator circuit as claimed in claim 2, and further comprising one of a frequency divider and frequency converter connected between said second voltagecontrolled oscillator and said comparator.

6. A voltage-controlled oscillator circuit as claimed in claim 2, and further comprising one of a frequency divider and frequency converter connected between said comparator and said oscillator.

7. A voltage-controlled oscillator circuit as claimed in claim 2, and further comprising one of a first frequency divider and first frequency converter connected between said second voltage-controlled oscillator and said comparator and one of a second frequency divider and second frequency converter connected between said comparator and said oscillator.

8. A voltage-controlled oscillator circuit as claimed in claim 2, and further comprising a frequency divider connected to the output of said first voltage-controlled oscillator circuit.

9. A variable-frequency oscillator for a [floppy disk] *device having a sequence of data which can be read therefrom and represented by a data signal, said variable frequency oscillator* comprising:

oscillator means for generating a stable pulse train;

a first phase-locked loop including a first [voltagecontrolled] *voltage controlled* oscillator [, said first phase-locked loop being synchronized with a sequence of data read from the floppy disk] *and first control means, said first control means for synthesizing a first control signal and a second control signal and for producing a first control voltage for synchronizing the first phase-locked loop with the sequence of data read from the device represented by the data signal wherein said first voltage controlled oscillator is responsive to said first control voltage for producing an output signal for the variable-frequency oscillator;* a second phase-locked loop *for producing said second control signal and* including *second control means and* a second [voltagecontrolled] *voltage controlled* oscillator having *substantially* the same [constants] *circuit structure* as *and being formed into a monolithic integrated circuit with* the first voltage[-] controlled oscillator, [said second phase-locked loop being synchronized with the output pulses from said oscillator means,] *said second control means for synthesizing said second control signal and a reference signal and for producing a second control voltage for synchronizing the second phase-locked loop with the pulse train of said oscillator means; and*

*a reference signal generator including two resistor means coupled to a common node and electrically connected in series between different power sources for producing said reference signal at said common node;*

*wherein* said first voltage[-] controlled oscillator in said first phase-locked loop being stabilized by [the control voltage applied to said second voltage-controlled oscillator in said second phase-locked loop] *said second control signal.*

10. A variable-frequency oscillator as claimed in claim 9, wherein said voltage controlled oscillators are ring oscillators, the frequency of oscillation of each voltage-controlled oscillator being controlled by controlling the currents flowing into said ring oscillators.

11. A variable-frequency oscillator as claimed in claim 9, and further comprising a digital circuit for counting pulses generated at regular intervals and delaying said pulses by a set period of time to delay the sequence of data read from the [floppy disk] *device* before application of said data to the first phase-locked loop.

12. A variable-frequency oscillator as claimed in claim 9, and further comprising means for shifting the phase of each output pulse from said first voltage-controlled oscillator in said first loop by 90 degrees , the output pulse of the first voltage control oscillator being a window waveform[,]*;* a flip-flop circuit, said flip-flop circuit being set by the data read from the [floppy disk] *device* and reset by the output from said means for shifting the phase; and a circuit triggered on the trailing edge of the output from said flip-flop circuit and delivering a pulse having a selected pulse width, said pulse being a read data pulse supplied to floppy disk controller and being located at the center position of the window waveform.

* * * * *